(12) United States Patent
Coustans et al.

(10) Patent No.: US 10,910,945 B2
(45) Date of Patent: Feb. 2, 2021

(54) ELEMENTARY CELL AND CHARGE PUMPS COMPRISING SUCH AN ELEMENTARY CELL

(71) Applicant: EM Microelectronic-Marin SA, Marin (CH)

(72) Inventors: Mathieu Coustans, Renens (CH); Lubomir Plavec, Brno (CZ); Mario Dellea, La Chaux-de-Fonds (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 16/402,905

(22) Filed: May 3, 2019

(65) Prior Publication Data

US 2019/0372458 A1 Dec. 5, 2019

(30) Foreign Application Priority Data

Jun. 4, 2018 (EP) ..................... 18175744

(51) Int. Cl.
*H02M 3/07* (2006.01)

(52) U.S. Cl.
CPC ...... *H02M 3/073* (2013.01); *H02M 2003/075* (2013.01)

(58) Field of Classification Search
CPC .. H02M 3/073; H02M 3/07; H02M 2003/075; G11C 5/145; G11C 16/30
See application file for complete search history.

(56) References Cited

U.S. PATENT DOCUMENTS

2004/0217803 A1 11/2004 Chou
2014/0375293 A1* 12/2014 Pan ..................... H02M 3/07
323/293

FOREIGN PATENT DOCUMENTS

| JP | 2005-184879 | 7/2005 |
| JP | 2010-207092 | 9/2010 |
| JP | 2015-126595 | 7/2015 |

OTHER PUBLICATIONS

Na Yan and Hao Min, "An improved charge pump with high efficiency for low voltage operations," doi: 10.1109/ICASIC.2005. 1611396 (Year: 2005).*

(Continued)

*Primary Examiner* — Sibin Chen
(74) *Attorney, Agent, or Firm* — Oblon, McClelland, Maier & Neustadt, L.L.P.

(57) ABSTRACT

The elementary pumping cell comprises an input (E) receiving an input voltage (Vin), a clock terminal (H) receiving a first clock signal (CK1) and an output (S), a first capacitor (C1) having a first terminal connected to the clock terminal and a second terminal, a first transistor (A1) having a first source/drain terminal coupled to the input, a second source/drain terminal and a gate terminal, a second transistor (A2) having a first source/drain terminal, a second source/drain terminal coupled to the input and a gate terminal coupled to the second terminal of the first capacitor, a third transistor (A3) having a first source/drain terminal coupled to the first source/drain terminal of the second transistor, a second source/drain terminal coupled to the gate terminal of the second transistor and a gate terminal coupled to the input, and a fourth transistor (A4) having a first source/drain terminal coupled to the second source/drain terminal of the first transistor, a second source/drain terminal coupled to the first source/drain terminal of the second and third transistors and a gate terminal coupled to the input. The gate terminal of the first transistor is coupled to the gate terminal of the second transistor.

6 Claims, 3 Drawing Sheets

(56) References Cited

OTHER PUBLICATIONS

Na Yan, et al. "An Improved Charge Pump with High Efficiency for Low Voltage Operations", ASIC, 2005.ASICON 2005. $6^{th}$ International Conference on Shanghai, China. Oct. 24-27, 2005. Piscataway, NJ, USA, IEEE, Piscataway, NJ, NJ, USA. vol. 2, Oct. 24, 2005 (Oct. 24, 2005), XP010904501, DOI: 10.1109/ICASIC.2005. 1611396, ISBN: 978-0-7803-9210-6, 4 pages.
Na Li, et al. "High efficiency four-phase ALL PMOS charge pump without body effects", Communications, Circuits and Systems, 2008. ICCCAS 2008. International Conference on, IEEE, Piscataway, NJ USA. May 25, 2008 (May 25, 2008), XP031353106, ISBN: 978-1-4244-2063-6, 5 pages.
European Search Report dated Nov. 23, 2018 in European Application 18175744.4 filed on Jun. 4, 2018 (with English translation of categories of Cited Documents).
Office Action dated Aug. 25, 2020 in Japanese Patent Application No. 2019-097323 (with English translation); 12 pgs.
Office Action dated Jun. 22, 2020 in Taiwan Patent Application No. 108114276 with English translation, 19 pages.
Office Action issued Nov. 4, 2020 in Korea Patent Application No. 10-2019-0063905 (with English translation); 15 pgs.
Na Yan, et al.; "A High Efficiency All-PMOS Charge Pump for Low-Voltage Operations"; 2005 IEEE Asian Solid-State Circuits Conference; Nov. 3, 2005; 4 pgs.

\* cited by examiner

ELEMENTARY CELL AND CHARGE PUMPS COMPRISING SUCH AN ELEMENTARY CELL

CROSS-REFERENCE TO RELATED APPLICATIONS

This application claims priority under 35 U.S.C. § 119 or 365 to European Application No. 18175744.4, filed Jun. 4, 2018. The entire contents of the above application(s) are incorporated herein by reference.

TECHNICAL FIELD OF THE INVENTION

The invention relates to the field of integrated circuits, and more particularly the charge pump circuits which, from a primary voltage source, generate a secondary voltage that is greater in absolute value.

STATE OF THE ART

Many electronic systems require more than one power supply voltage level to operate. For example, some types of non-volatile memory circuits, which can typically use a single 0.9 V power supply as primary power supply source often also require higher power supply voltages, for example of 10 V to 15 V for the programming or the erasing of functions. Likewise, the circuits developed to be used in liquid crystal screens, radio frequency power amplifiers and, to a certain extent, switched capacitor bootstrap circuits, often require higher power supply voltages than the primary voltage to operate. It is therefore essential to provide in the integrated circuits voltage boost circuits for generating the required power supply voltage from the primary power supply voltage of the integrated circuit, to avoid the need for additional external power supplies. To do this, voltage step circuits or charge pump circuits have been developed which generate the higher voltages from the primary power supply voltage.

FIGS. 1a, 1b schematically represent the operation of an ideal charge pump cell, in which the output voltage Vout is substantially equal to twice the input voltage Vin. The cell comprises:
  an input terminal E and an output terminal S, the voltage Vout being available on the output terminal when the input voltage Vin is applied to the input terminal, a clock terminal H for receiving a clock signal CK,
  a so-called pumping capacitor C comprising a first terminal coupled to the clock terminal H, and a second terminal,
  a capacitor C' comprising a first terminal coupled to a ground of the cell and a second terminal coupled to the output terminal S, the voltage Vout being available between the two terminals of the capacitor C',
  a switch INT arranged to couple the second terminal of the capacitor C alternately to the input terminal E or to the output terminal S as a function of the clock signal CK.

The general operation of the charge pump cell is as follows. The clock signal is, conventionally, a periodic rectangular signal which alternates between a zero potential corresponding to the ground of the circuit and a high potential generally equal to a primary power supply potential Vdd of the circuit. During a first phase (FIG. 1a), when the clock signal CK is zero, the first terminal of the capacitor C is grounded and the switch INT links the second terminal of the capacitor C to the input terminal E of the cell to which the voltage Vin is applied. The capacitor C is charged with a current Iin, until the second terminal of the capacitor C is at the potential Vin. During a second phase (FIG. 1b), the clock signal CK switches from the zero potential to the Vdd potential and the switch INT toggles to link the second terminal of the capacitor C to the second terminal of the capacitor C'. With the potential on the first terminal of the capacitor C switching from 0 to Vdd, the potential on the second terminal of the capacitor C is pushed from Vin to Vin+Vdd. Since the potential on the second terminal of the capacitor C is greater than the potential on the second terminal of the second capacitor C', the capacitor C discharges into the capacitor C' creating a current Io such that the potential on the output terminal S climbs. The first phase and the second phase are repeated in line with the changes of state of the clock signal such that, in steady state operation and from an input potential Vin, a potential Vin+Vdd greater than Vin is available at the output of the cell. By choosing Vin=Vdd, the potential at the output of the cell is twice the potential applied to the input.

An embodiment of a charge pump can be cited for example that is described in the document by R. Pelliconi, D. Iezzi, A. Baroni, M. Pasotti, and P. L. Rolandi, "Power efficient charge pump in deep submicron standard CMOS technology," IEEE J. Solid-State Circuits, vol. 38, no. 6, pp. 1068-1071, 2003. However, that requires isolated wells, because the electrical circuit is not produced with transistors of one and the same type of conductivity, which constitutes a drawback.

One possible implementation of a charge pump half-cell (or CP half-cell) has been proposed in the document by N. Li, Z. Huan, M. Jiang and Y. Inoue, "High efficiency four-phase all PMOS charge pump without body effect", 2008 Int. Conf. Commun. Circuits Syst. Proceedings, ICC-CAS 2008, no. 1, pp 1083-1087, 2008. This document proposes a CP half-cell conforming to FIG. 2, comprising an elementary pumping cell CE0 comprising:
  an input terminal E arranged to receive an input voltage Vin, a clock terminal H arranged to receive a first clock signal CK1 and an output terminal S,
  a first capacitor C1 comprising a first terminal connected to the clock terminal H and a second terminal,
  a first transistor A1 comprising a first source/drain terminal coupled to the input terminal E, a second source/drain terminal and a gate terminal,
  a second transistor A2 comprising a first source/drain terminal coupled to the output terminal S of the elementary cell, a second source/drain terminal coupled to the input terminal E and a gate terminal coupled to the second terminal of the first capacitor C1,
  a third transistor A3 comprising a first source/drain terminal coupled to the first source/drain terminal of the second transistor A2, a second source/drain terminal coupled to the gate terminal of the second transistor A2 and a gate terminal coupled to the input terminal E, and
  a fourth transistor A4 comprising a first source/drain terminal coupled to the second source/drain terminal of the first transistor A1, a second source/drain terminal coupled to the first source/drain terminal of the second A2 and third A3 transistors and to the gate terminal of the first transistor A1, and a gate terminal coupled to the input terminal E.

In addition to the elementary cell CE0, the CP half-cell of FIG. 2 also comprises:
  a second capacitor C2 comprising a first terminal intended to receive a second clock signal CK2 and a second terminal, a third capacitor C3 comprising a first terminal intended to receive a third clock signal CK3 and a second terminal coupled to the output terminal S of the elementary cell CE1, a fifth transistor A5 comprising a first source/drain terminal coupled to an output terminal Vout of the CP half-cell, a second source/drain terminal coupled to the output terminal S of the elementary cell CE0 and a gate terminal coupled to the second terminal of the second capacitor C2.

Compared to earlier cell structures, the structure of the CP half-cell of FIG. 2 offers the advantage of using only transistors of PMOS type, and not a combination of NMOS and PMOS transistors. It can thus be produced directly on an N-type substrate, without the need to produce one or more N-wells on a P-substrate, as is usually the case for circuits comprising NMOS transistors and PMOS transistors. The production of the cell is thus greatly simplified.

Nevertheless, the operation of the CP half-cell of FIG. 2 is not optimal, in particular the change of state of the transistor A1 is not perfect. Indeed, when the third clock signal CK3 drops from Vdd to zero, the voltage V1 between the output terminal S and the ground drops from Vout to Vout−Vdd<Vin such that the transistors A3 and A4 switch off. The transistor A1 is assumed to switch on, but it does so only partially such that the well potential of the transistor A2 cannot drop to Vin. The conduction threshold of the transistor A2 will be higher, because of the well effect, the transistor A2 switches with difficulty such that the charge transfer between the input terminal and output terminal is not efficient.

SUMMARY OF THE INVENTION

The object of the invention is to provide an alternative solution to the known solution of FIG. 2, in which the charge transfer between the input terminal and the output terminal of the elementary pumping cell is more efficient.

To this end, the invention proposes a novel elementary pumping cell, also conforming to the preamble of claim 1 and partly to the elementary cell of FIG. 2, characterized in that the gate terminal of the first transistor is now connected to the gate terminal of the second transistor of the elementary cell, instead of being connected to the output terminal of the elementary cell as described in FIG. 2. As will become more clear later, this novel connection of the gate of the first transistor makes it possible, upon a change of state of the first clock signal and/or of the third clock signal, to make the first transistor more fully on for a better charge transfer between the input terminal of the elementary cell and the well of the second transistor. A better control of the source/well voltage of the second transistor follows therefrom, and consequently a state change threshold that is better controlled for the second transistor. The overall efficiency of the elementary charge pump cell is thus enhanced.

The transistors of the elementary cell are preferentially of the same type, and preferably of P type. The use of P-type transistors only offers the advantage of not requiring the use of technology requiring a so-called triple-well semiconductor doping well in order to isolate the NMOS transistors from the substrate. Each transistor of the elementary cell also comprises a well terminal, and the well terminals of all the transistors of the elementary cell are coupled together, preferably at the second source/drain terminal of the first transistor.

The novel elementary pumping cell can advantageously be used to produce a charge-pump half-cell (or CP half-cell) comprising:

an elementary cell according to the invention and as described above, comprising a clock terminal intended to receive a first clock signal and an output terminal, a second capacitor comprising a first terminal intended to receive a second clock signal and a second terminal, a third capacitor comprising a first terminal intended to receive a third clock signal and a second terminal coupled to the output terminal of the elementary cell, a fifth transistor comprising a first source/drain terminal coupled to an output terminal of the CP half-cell, a second source/drain terminal coupled to the output terminal of the elementary cell and a gate terminal coupled to the second terminal of the second capacitor.

The CP half-cell according to the invention operates overall as follows. The second transistor and the fifth transistor both have the same role as the switch INT, and the third capacitor has a pumping function. When the second transistor is on, the third capacitor is linked to the input terminal of the elementary cell and charges. When the fifth transistor is on, the third capacitor discharges powering a downstream circuit linked to the output terminal of the CP half-cell.

The third transistor is on when the second transistor is on or when the fifth transistor is on. The third transistor has a boost stage transistor function. It improves the charge transfer during the charging and the discharging of the third capacitor.

The main function of the first transistor and the fourth transistor is to set the potential of the wells of the transistors of the elementary cell, either at the potential applied to the input terminal of the elementary cell when the first transistor is on, or at the potential available on the output terminal of the elementary cell when the fourth transistor is on. The first transistor, and in particular its novel gate connection according to the invention, and the fourth transistor thus make it possible to best control the threshold and the changes of state of the second transistor, for a more efficient charge transfer between the input terminal and the output terminal of the elementary cell.

The novel elementary pumping cell can also be advantageously used to produce a Dickson-type charge pump, a cross-coupled-type charge pump or a bootstrap circuit, as will be better seen hereinbelow.

BRIEF DESCRIPTION OF THE FIGURES

The invention will be described hereinbelow in more detail using the attached drawings, given as nonlimiting examples, in which.

DETAILED DESCRIPTION OF THE INVENTION

Figure 1A:
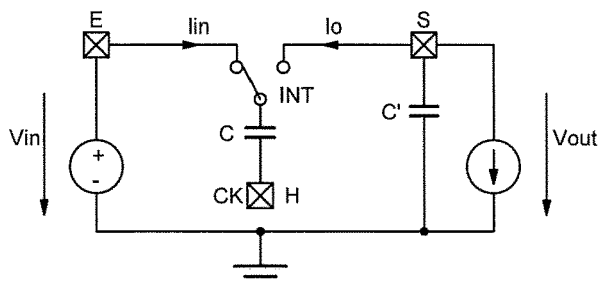
FIGS. 1a and 1b, already cited, schematically represent the two phases of operation of a charge pump, FIG. 2, already cited, shows a known charge pump structure.
Figure 1B:
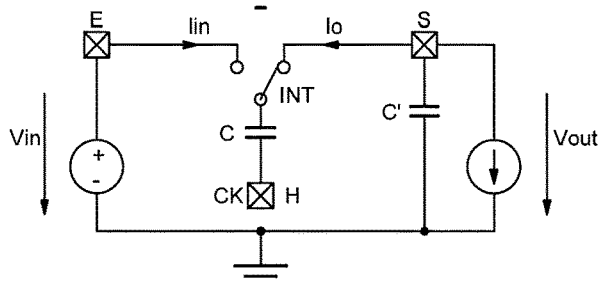
Figure 2:
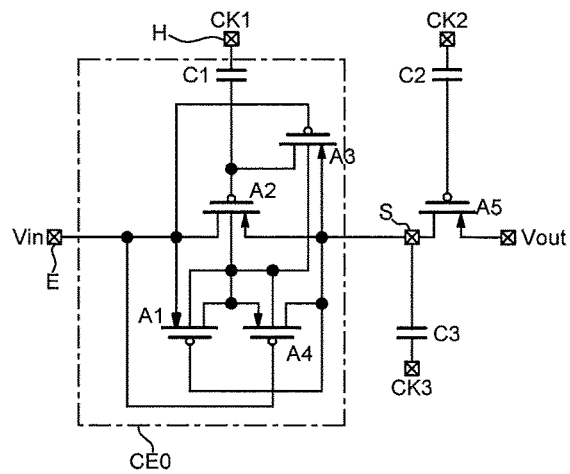
Figure 3A:
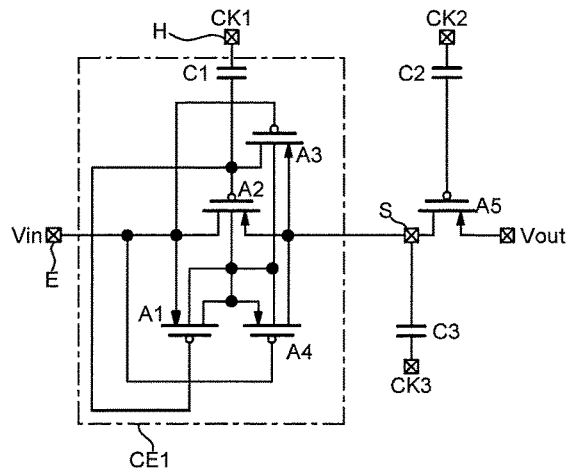
FIG. 3a shows a diagram of a charge pump half-cell comprising an elementary cell according to the invention.

As stated previously, the invention proposes a charge pump half-cell comprising an elementary pumping cell CE1, as shown in FIG. 3a, comprising:
- an input terminal E arranged to receive an input voltage Vin, a clock terminal H arranged to receive a first clock signal CK1 and an output terminal S,
- a first capacitor C1 comprising a first terminal connected to the clock terminal H and a second terminal,
- a first transistor A1 comprising a first source/drain terminal coupled to the input terminal E, a second source/drain terminal and a gate terminal,
- a second transistor A2 comprising a first source/drain terminal coupled to the output terminal S of the elementary cell CE1, a second source/drain terminal coupled to the input terminal E and a gate terminal coupled to the second terminal of the first capacitor C1,
- a third transistor A3 comprising a first source/drain terminal coupled to the first source/drain terminal of the second transistor A2, a second source/drain terminal coupled to the gate terminal of the second transistor A2 and a gate terminal coupled to the input terminal E, and
- a fourth transistor A4 comprising a first source/drain terminal coupled to the second source/drain terminal of the first transistor A1, a second source/drain terminal coupled to the first source/drain terminal of the second A2 and third A3 transistors and a gate terminal coupled to the input terminal E.

The elementary cell CE1 according to the invention is characterized in that the gate terminal of the first transistor A1 is coupled to the gate terminal of the second transistor A2.

In FIG. 3a, the first, second, third and fourth transistors A1, A2, A3, A4 are PMOS-type transistors. They each comprise a well terminal and said well terminals are coupled together (and are therefore at the same potential) at the second source/drain terminal of the first transistor A1.

The elementary cell CE1 behaves as a controlled switch. When the clock signal CK1 applied to its clock terminal H is at low potential, the output S of the elementary cell CE1 is linked to its input E. Conversely, when the clock signal CK1 is at high potential, the output of the elementary cell is isolated from its input E.

According to one implementation, an elementary cell CE1 according to the invention is used to produce a charge pump half-cell (FIG. 3a) comprising:
- an elementary cell CE1 conforming to the elementary cell of FIG. 3a, comprising a clock terminal H intended to receive a first clock signal CK1 and an output terminal S,
- a second capacitor C2 comprising a first terminal intended to receive a second clock signal CK2 and a second terminal,
- a third capacitor C3 comprising a first terminal intended to receive a third clock signal CK3 and a second terminal coupled to the output terminal S of the elementary cell CE1,
- a fifth transistor A5 comprising a first source/drain terminal coupled to an output terminal Vout of the CP half-cell, a second source/drain terminal coupled to the output terminal S of the elementary cell CE1 and a gate terminal coupled to the second terminal of the second capacitor C2.

Figure 3B:
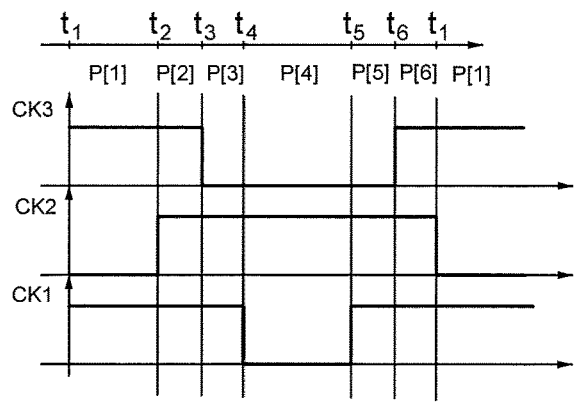
FIG. 3b shows an example of clock signals likely to be used to control the charge pump half-cell of FIG. 3a, FIG. 3c schematically represents the operation over time of the charge pump half-cell of FIG. 3a controlled by the clock signals of FIG. 3b.

FIG. 3b shows a set of clock signals likely to be used to control the circuit of FIG. 3a. The clock signals CK1, CK2, CK3 are periodic signals, of the same period, and arranged to take two values, 0 or Vdd, Vdd being a primary power supply potential of the circuit.

Figure 3C:
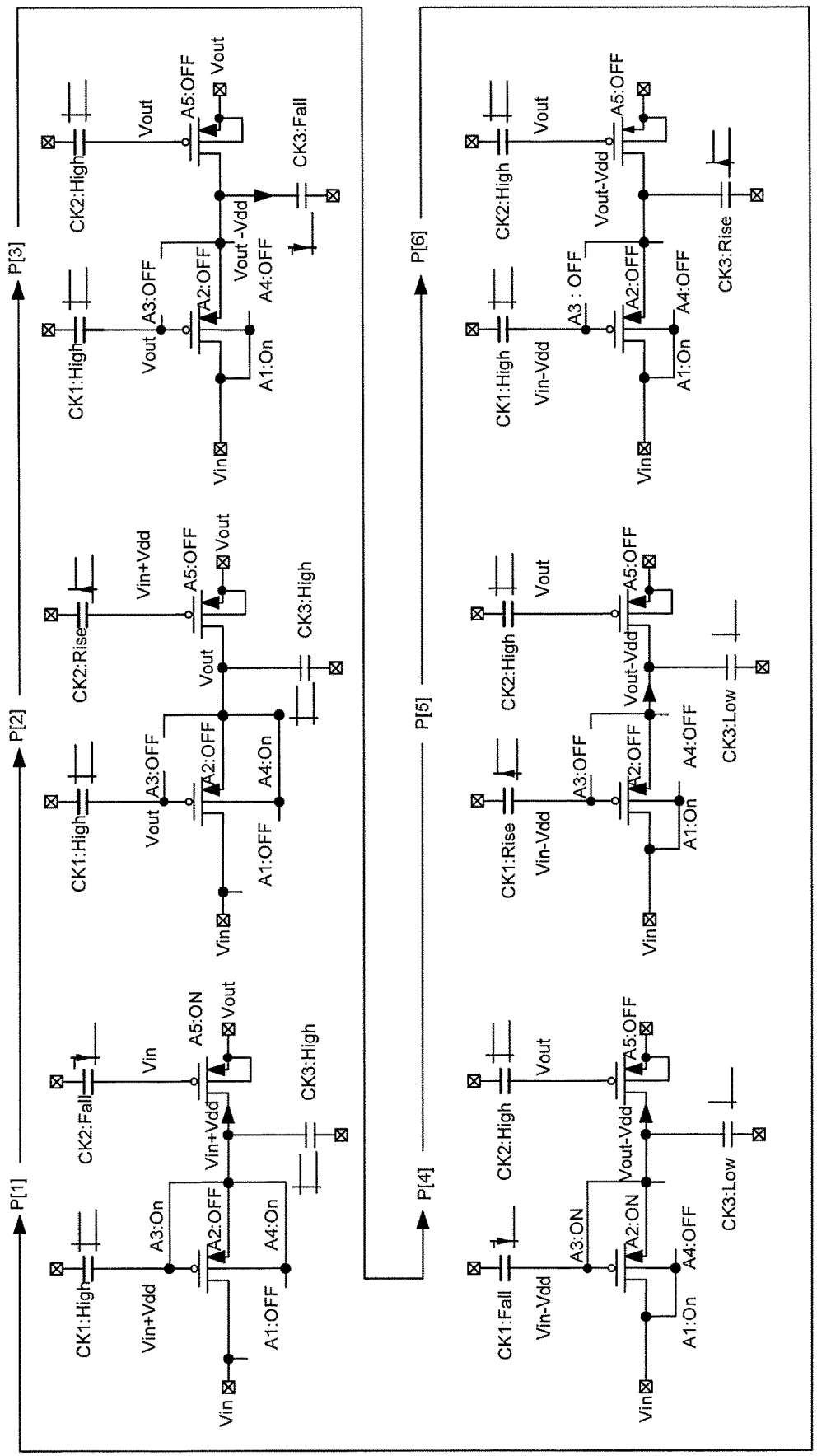

The operation of the pumping half-cell of FIG. 3a in steady state operation will now be described in relation to FIGS. 3b and 3c.

At an instant t1, the second clock signal CK2 drops from Vdd to 0, thus switching on the fifth transistor A5. Since the signal CK1 is at the Vdd potential, the third capacitor C3 has its first terminal at the Vdd potential and its second terminal at the highest potential Vin+Vdd such that C3 discharges increasing the potential Vout on the output terminal of the CP half-cell during a first phase P[1]. The potential on the second terminal of the third capacitor C3 becomes equal to Vout.

At the instant t2, the second clock signal CK2 climbs from 0 to Vdd such that the fifth transistor A5 switches off. The third capacitor C3 is isolated during a second phase P[2].

At the instant t3, the third clock signal CK3 drops from Vdd to 0, causing a drop in the potential on the second terminal of the third capacitor C3 from Vout to Vout−Vdd during a third phase P[3], the third capacitor C3 remaining isolated. The fourth transistor A4, previously on, switches off, and the first transistor A1, previously off, switches on such that the well potential of the transistors A1 to A4 switches from Vout to Vin and the source/well voltage of the transistor A2 decreases.

At the instant t4, the first clock signal CK1 drops from Vdd to 0, resulting in a drop of −Vdd on the gate potential of the transistors A2 and A1. A2 switches on and A1 remains on. The first terminal of the third capacitor C3 is at a zero potential and the second terminal of the third capacitor C3 is linked to the input terminal E to which the Vin potential is applied. The third capacitor C3 charges during a fourth phase P[4]. The transistor A3 that is on reinforces the charge transfer to the third capacitor C3.

At the instant t5, the potential of the first clock signal climbs from 0 to Vdd. The gate/source voltages of the transistors A2 and A3 become positive such that the transistors A2 and A3 switch off. The gate/source voltage of the transistor A1 climbs also by Vdd, but remains negative such that the transistor A1 remains on. The third capacitor C3 is isolated during a fifth phase P[5].

At the instant t6, the third clock signal CK3 increases from 0 to Vdd, resulting in an increase in the potential on the second terminal of the third capacitor C3 from Vout−Vdd to Vout during a sixth phase P[6]. The transistors A2, A3 and A4 remain OFF, as does the transistor A5. The third capacitor C3 thus remains isolated.

The phases P[1] to P[6] are then repeated cyclically. The phases P[1] and P[4] correspond to charge transfer phases. During the phase P[1], the third capacitor C3 discharges to the output terminal Vout of the CP half-cell then, during the phase P[4], the third capacitor C3 charges on the input terminal E of the elementary cell CE1. The phases P[2], P[3] and P[5], P[6] are brief intermediate phases ensuring the switching of the transistors.

According to another implementation, an elementary cell according to the invention is used to produce a Dickson-type charge pump (FIG. 4) comprising:
- a first elementary cell CE11 and a second elementary cell CE12 produced according to one of claims 1 to 3, each elementary cell CE11, CE12 comprising an input terminal E1, E2, a clock terminal H1, H2 and an output terminal S1, S2, the input terminal E2 of the second elementary cell CE12 being coupled to the output terminal S1 of the first elementary cell CE11, a fourth capacitor C11 comprising a first terminal intended to receive a fourth clock signal CK11 and a second terminal coupled to the output terminal S1 of the first elementary cell CE11, a fifth capacitor C12 comprising a first terminal intended to receive a fifth clock signal CK12 and a second terminal coupled to the output terminal S2 of the second elementary cell CE12.

Figure 4:
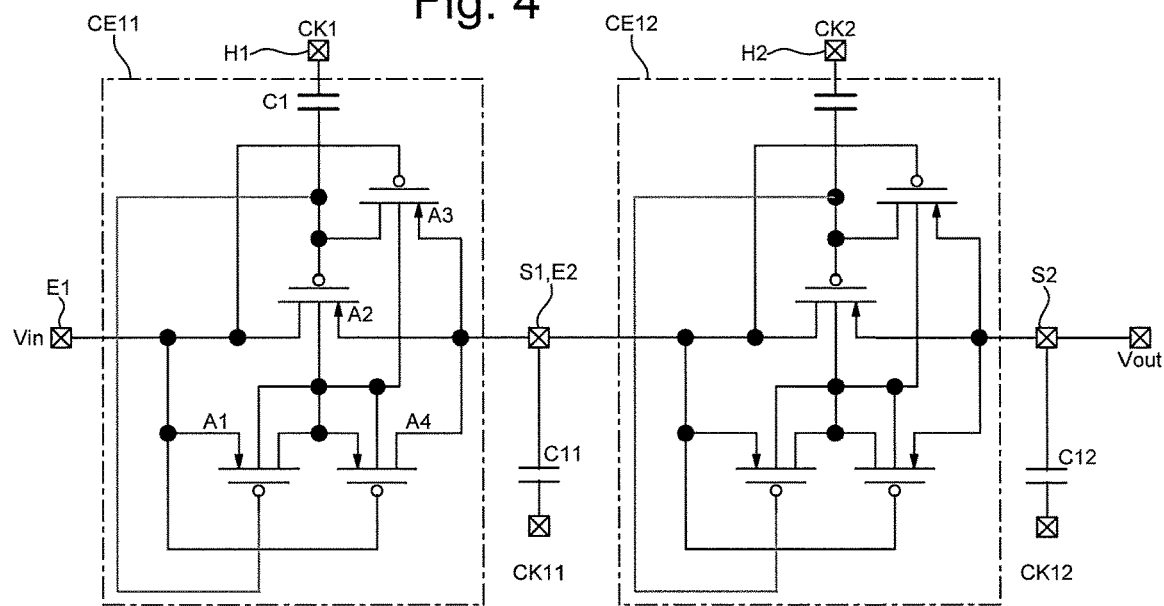
FIG. 4 shows a diagram of a Dickson-type charge pump comprising elementary cells according to the invention.

The charge pump of FIG. 4 is thus produced by associating two elementary cells CE11, CE12 in series, a pumping capacitor C11, C12 being positioned at the output of each elementary cell. The clock signals CK1, CK2, CK11, CK12 are chosen such that:

during a first phase, the fourth capacitor C11 is charged and the fifth capacitor C12 is discharged into a downstream circuit (not represented), during a second phase, the fourth capacitor C11 is discharged into the fifth capacitor C12.

It is possible to associate more than two elementary cells, to obtain a higher output potential Vout.

According to yet another implementation, an elementary cell according to the invention is used to produce a cross-coupled-type charge pump (FIG. 5) comprising:

a first elementary cell CE21 and a second elementary cell CE22 produced according to one of claims 1 to 3, each elementary cell CE21, CE22 comprising an input terminal E1, E2, a clock terminal H1, H2 and an output terminal S1, S2, the input terminal E2 of the second elementary cell CE22 being coupled to the input terminal E1 of the first elementary cell CE21, the clock terminal H1 of the first elementary cell CE21 being intended to receive a first clock signal CK1 and the clock terminal H2 of the second elementary cell CE22 being intended to receive a second clock signal CK2, a sixth capacitor C21 comprising a first terminal intended to receive a sixth clock signal CK21 and a second terminal coupled to the output terminal S2 of the second elementary cell CE22, a seventh capacitor C22 comprising a first terminal intended to receive a seventh clock signal CK22 and a second terminal coupled to the output terminal S1 of the first elementary cell CE21, a sixth transistor A21 comprising a first source/drain terminal coupled to an output terminal Vout of the cross-coupled-type charge pump, a second source/drain terminal coupled to the output terminal S1 of the first elementary cell CE21 and a gate terminal coupled to the second terminal of the sixth capacitor C21, a seventh transistor A22 comprising a first source/drain terminal coupled to the output terminal Vout of the cross-coupled-type charge pump, a second source/drain terminal coupled to the output terminal S2 of the second elementary cell CE22 and a gate terminal coupled to the second terminal of the seventh capacitor C22.

Figure 5:
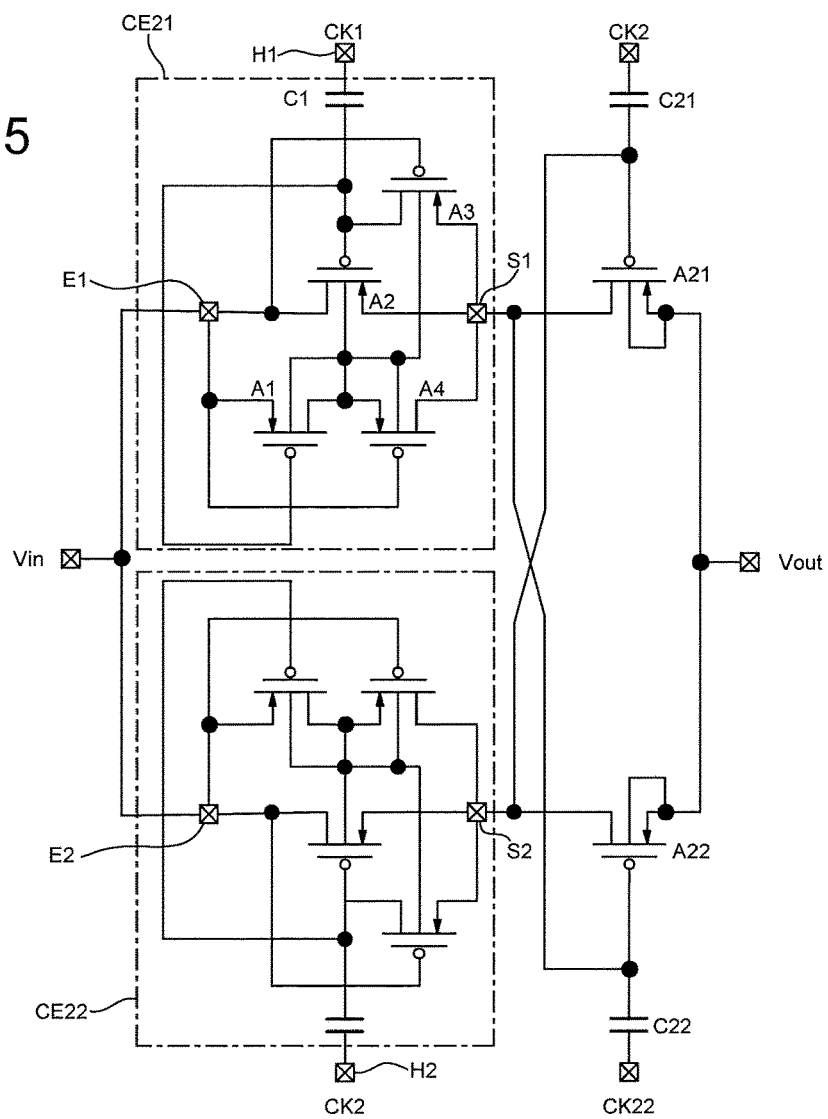
FIG. 5 shows a diagram of a cross-coupled-type charge pump comprising elementary cells according to the invention.

The charge pump of FIG. 5 is thus produced by associating two elementary cells CE21, CE22 in parallel, the outputs of the elementary cells being cross-connected. The clock signals CK1, CK2, CK21, CK22 are chosen such that:

during a first phase, the elementary cell CE21 couples the seventh capacitor C22 to the potential Vin and the elementary cell CE22 couples the sixth capacitor C21 to the potential Vin, the transistors A21 and A22 being off. The capacitors C21 and C22 charge, and during a second phase, the capacitors C21, C22 are isolated from the elementary cells CE21, CE22 and the transistors A21, A22 are on. The capacitors C21 and C22 discharge to the output terminal Vout.

The invention claimed is:

1. An Elementary pumping cell comprising:
   an input terminal arranged to receive an input voltage, a clock terminal arranged to receive a first clock signal and an output terminal;
   a first capacitor comprising a first terminal connected to the clock terminal and a second terminal;
   a first transistor comprising a first source/drain terminal coupled to the input terminal, a second source/drain terminal and a gate terminal;
   a second transistor comprising a first source/drain terminal coupled to the output terminal of the elementary cell, a second source/drain terminal coupled to the input terminal and a gate terminal coupled to the second terminal of the first capacitor;
   a third transistor comprising a first source/drain terminal coupled to the first source/drain terminal of the second transistor, a second source/drain terminal coupled to the gate terminal of the second transistor and a gate terminal coupled to the input terminal; and
   a fourth transistor comprising a first source/drain terminal coupled to the second source/drain terminal of the first transistor, a second source/drain terminal coupled to the first source/drain terminal of the second and third transistors and a gate terminal coupled to the input terminal,
   wherein the gate terminal of the first transistor is directly coupled to the gate terminal of the second transistor.

2. The Elementary cell according to claim 1, wherein the first, second, third and fourth transistors each comprise a well terminal, said well terminals being coupled together at the second source/drain terminal of the first transistor.

3. The Elementary cell according to claim 1, wherein the first, second, third and fourth transistors are transistors of the same type and preferably of PMOS type.

4. A Charge pump half-cell comprising:
   an elementary cell according to claim 1, comprising a clock terminal intended to receive a first clock signal and an output terminal;
   a second capacitor comprising a first terminal intended to receive a second clock signal and a second terminal;
   a third capacitor comprising a first terminal intended to receive a third clock signal and a second terminal coupled to the output terminal of the elementary cell; and
   a fifth transistor comprising a first source/drain terminal coupled to an output terminal of the CP half-cell, a second source/drain terminal coupled to the output terminal of the elementary cell and a gate terminal coupled to the second terminal of the second capacitor.

5. A Dickson-type charge pump, comprising:
   a first elementary cell and a second elementary cell produced according to claim 1, each elementary cell comprising an input terminal, a clock terminal and an output terminal, the input terminal of the second elementary cell being coupled to the output terminal of the first elementary cell;
   a fourth capacitor comprising a first terminal intended to receive a fourth clock signal and a second terminal coupled to the output terminal of the first elementary cell; and a fifth capacitor comprising a first terminal intended to receive a fifth clock signal and a second terminal coupled to the output terminal of the second elementary cell.

6. A Cross-coupled-type charge pump, comprising:
a first elementary cell and a second elementary cell produced according to claim 1, each elementary cell comprising an input terminal, a clock terminal and an output terminal, the input terminal of the second elementary cell being coupled to the input terminal of the first elementary cell, the clock terminal of the first elementary cell being intended to receive a first clock signal and the clock terminal of the second elementary cell being intended to receive a second clock signal;
a sixth capacitor comprising a first terminal intended to receive a sixth clock signal and a second terminal coupled to the output terminal of the second elementary cell;
a seventh capacitor comprising a first terminal intended to receive a seventh clock signal and a second terminal coupled to the output terminal of the first elementary cell;
a sixth transistor comprising a first source/drain terminal coupled to an output terminal of the cross-coupled-type charge pump, a second source/drain terminal coupled to the output terminal of the first elementary cell and a gate terminal coupled to the second terminal of the sixth capacitor; and
a seventh transistor comprising a first source/drain terminal coupled to the output terminal of the cross-coupled-type charge pump, a second source/drain terminal coupled to the output terminal of the second elementary cell and a gate terminal coupled to the second terminal of the seventh capacitor.

* * * * *